(12) United States Patent
Guo (10) Patent No.: US 8,951,715 B2
(45) Date of Patent: Feb. 10, 2015

(54) METHOD OF FORMING PATTERNED FILM ON A BOTTOM AND A TOP-SURFACE OF A DEEP TRENCH

(71) Applicant: Shanghai Huahong Grace Semiconductor Manufacturing Corporation, Shanghai (CN)

(72) Inventor: Xiaobo Guo, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/082,758

(22) Filed: Nov. 18, 2013

(65) Prior Publication Data

US 2014/0141615 A1    May 22, 2014

(30) Foreign Application Priority Data

Nov. 21, 2012   (CN) .......................... 2012 1 0473220

(51) Int. Cl.
*G03F 7/26*       (2006.01)
*H01L 21/302*   (2006.01)
(52) U.S. Cl.
CPC ................................... *H01L 21/302* (2013.01)
USPC ............ 430/315; 430/313; 430/314; 430/311

(58) Field of Classification Search
USPC .................. 430/313, 325, 326, 314, 315, 330
See application file for complete search history.

(56) References Cited

U.S. PATENT DOCUMENTS

| 5,312,717 | A | * | 5/1994 | Sachdev et al. | 430/313 |
| 5,348,619 | A | * | 9/1994 | Bohannon et al. | 438/734 |
| 5,686,354 | A | * | 11/1997 | Avanzino et al. | 216/18 |
| 2004/0132290 | A1 | * | 7/2004 | Schmidt | 438/689 |
| 2008/0268607 | A1 | * | 10/2008 | Sim | 438/421 |

* cited by examiner

*Primary Examiner* — Caleen Sullivan
(74) *Attorney, Agent, or Firm* — MGK, LLC (57) ABSTRACT

A method of forming a patterned film on both a bottom and a top-surface of a deep trench is disclosed. The method includes the steps of: 1) providing a substrate having a deep trench formed therein; 2) growing a film over a bottom and a top-surface of the deep trench; 3) coating a photoresist in the deep trench and over the substrate and baking the photoresist to fully fill the deep trench; 4) exposing the photoresist to form a latent image that partially covers the deep trench in the photoresist; 5) silylating the photoresist with a silylation agent to transform the latent image into a silylation pattern; 6) etching the photoresist to remove a portion of the photoresist not covered by the silylation pattern; and 7) etching the film to form a patterned film on both the bottom and the top-surface of the deep trench.

12 Claims, 7 Drawing Sheets

FIG. 1

Prior Art

FIG. 2a

Prior Art

FIG. 2b

Prior Art

METHOD OF FORMING PATTERNED FILM ON A BOTTOM AND A TOP-SURFACE OF A DEEP TRENCH

CROSS-REFERENCES TO RELATED APPLICATIONS

This application claims the priority of Chinese patent application number 201210473220.7, filed on Nov. 21, 2012, the entire contents of which are incorporated herein by reference.

TECHNICAL FIELD

The present invention relates, in general, to the fabrication of semiconductor integrated circuits, and in particular, to a method of forming a patterned film on a bottom and a top-surface of a deep trench.

BACKGROUND

Figure 1:
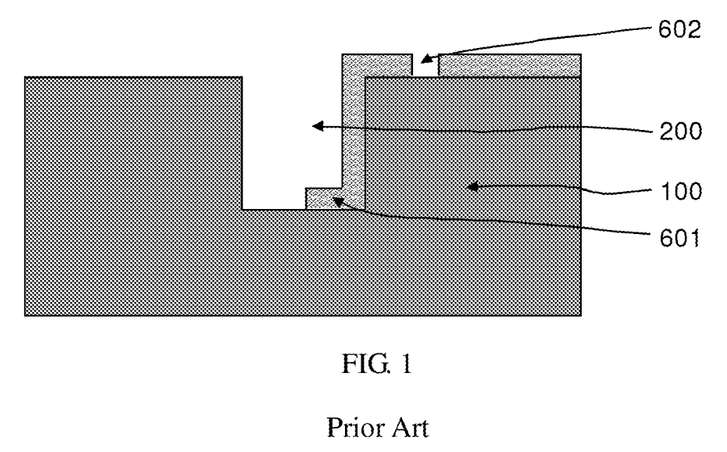
FIG. 1 shows a schematic illustration of a Z-direction sensor of a three-dimensional MEMS device.
Figure 2A:
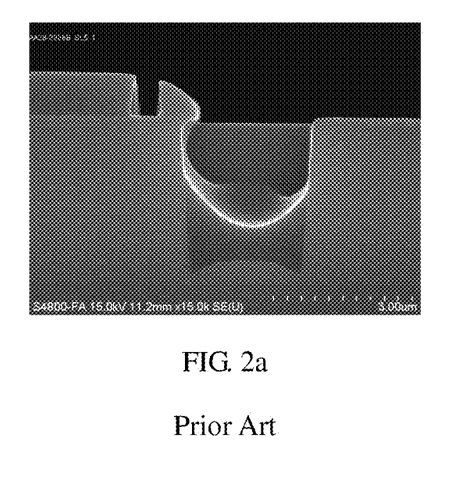
FIG. 2a is a photo showing the result of a conventional one-step photolithographic process using positive photoresist.
Figure 2B:
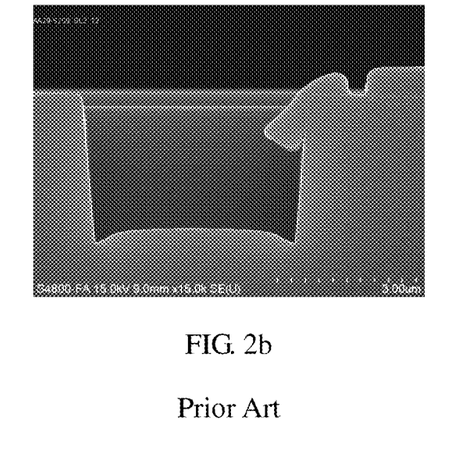
FIG. 2b is a photo showing the result of a conventional one-step photolithographic process using negative photoresist.

In some semiconductor devices having deep trenches formed therein, it is required to form a patterned film both on bottom of the deep trenches and over the substrate. For example, in a Z-direction sensor of a three-dimensional micro-electromechanical systems (MEMS) device, as shown in FIG. 1, patterned magnetic films 601 and 602 are needed to be formed respectively on bottom of the deep trenches 200 and over the substrate 100. FIGS. 2a and 2b are photos respectively showing the results of the conventional one-step photolithographic processes using respective positive (FIG. 2a) and negative (FIG. 2b) photoresists. As illustrated in the photos, due to a limited depth of focus (DOF) and the absorption of the exposure light by the photoresist during the exposure process, neither the positive nor the negative photoresist approach could ensure a sufficient light intensity for photoresist coated on the bottom of the deep trench, such that it is impossible to form a desired photoresist pattern on the bottom of the deep trench after the development process. Thus, this approach is not able to simultaneously forming the desired magnetic film patterns respectively on bottom of the deep trenches and over the substrate in a subsequent etching process.

The existing method for addressing the above-mentioned issues includes two photolithographic processes and two etching processes. The method includes the following steps: 1) performing a first photoresist coating, exposure and development process to form a first desired photoresist pattern over a magnetic film which is formed in advance on the bottom of the deep trench 200; 2) forming the magnetic film pattern 601 covering part of the bottom of the substrate 100 (see FIG. 1) by etching the underlying magnetic film using the first photoresist pattern formed in step 1) as a mask; 3) performing a second photoresist coating, exposure and development process to form a second desired photoresist pattern over a magnetic film which is formed in advance over the substrate 100; and 4) forming the magnetic film pattern 602 covering a top surface of the substrate 100 (see FIG. 1) by etching the underlying magnetic film using the second photoresist pattern formed in step 3) as a mask. Although this method is capable of addressing the above-mentioned issues, the adoption of two photoresist coating processes, two exposure processes (which need two masks during the two exposure processes), two development processes and two etching processes leads to high complexity and cost.

SUMMARY

The present invention addresses the above-mentioned high complexity and cost issues of the prior art by presenting a method capable of simultaneously forming a patterned film respectively on a top and a bottom of a deep trench.

The method of simultaneously forming a patterned film respectively on a top and a bottom of a deep trench includes the steps of: step 1) providing a substrate having a deep trench formed therein; step 2) growing a film over a bottom and a top of the deep trench; step 3) coating a photoresist in the deep trench and over the substrate and baking the photoresist to fully fill the deep trench with the baked photoresist; step 4) exposing the photoresist to form a latent image therein, wherein the latent image partially covers the deep trench; step 5) silylating the photoresist with a silylation agent to transform the latent image into a silylation pattern; step 6) etching the photoresist using the silylation pattern as a mask to remove a portion of the photoresist not covered by the silylation pattern; and step 7) etching the film using the silylation pattern and the remaining portion of the photoresist as a mask to form a patterned film respectively on the top and the bottom of the deep trench.

In the step 2), the film may be one or any combination of a dielectric film, a metal silicide film and a metal film.

In step 3), the baked photoresist may have a thickness of 0.5 $\mu m$ to 50 $\mu m$, and the photoresist may be coated by spin-coating or spray-coating.

The photoresist coated in step 3) does not contain hydroxyl or carboxylic acid group, but after step 4), the exposed portion of the photoresist, namely the latent image, contains hydroxyl and/or carboxylic acid groups due to the exposure process.

In step 4), the photoresist may be exposed with a light source selected from the group consisting of a 436-nm g-line source, a 365-nm i-line source, a 248-nm KrF source and a 193-nm ArF source.

In step 5), the silylation agent may be selected from the group consisting of hexamethyldisilazane, tetramethyldisilazane, dimethylsilyldimethylamine and (N,N-dimethylamino) trimethylsilane, and preferably, hexamethyldisilazane is selected. Additionally, the silylation may be performed by exposing the photoresist with the latent image formed in step 4) to the silylation agent in a gas or liquid state at a temperature of 50° C. to 150° C. for 30 seconds to 300 seconds.

In step 6), the photoresist may be etched by a dry etching process, preferably using oxygen-based plasma with an oxygen flow rate of 50 standard $cm^3$/min to 2000 standard $cm^3$/min, a pressure of 20 mTorr to 2000 mTorr and an RF source power of 100 watts to 1500 watts.

in the step 7), the film may be etched by a wet or a dry etching process according to different materials of the film.

Compared with the prior art, the method of the present invention has the following benefits: the method dry etches the photoresist coated on a bottom of the deep trench by using an oxygen-based etchant and the silylation pattern as a mask, thereby forming the photoresist pattern on bottom of the deep trench through a dry etching process instead of a development process, this addresses the prior art issue that no photoresist pattern could be formed on bottom of the deep trench after development due to a limited capacity of the existing photolithography equipment. And the method of the present invention also addresses the prior art issue of high complexity and cost caused by the adoption of two photolithographic processes and two etching processes by involving only one photolithographic process and two etching processes.

BRIEF DESCRIPTION OF THE DRAWINGS

FIGS. 4a-4g show cross-sectional views depicting the steps of the method of forming a patterned film on a bottom and a top-surface of a deep trench in accordance with the embodiment of the present invention, in which.

DETAILED DESCRIPTION

The invention, in its several specific embodiments, is described below together with figures herein referenced and incorporated by reference in this disclosure.

Figure 3:
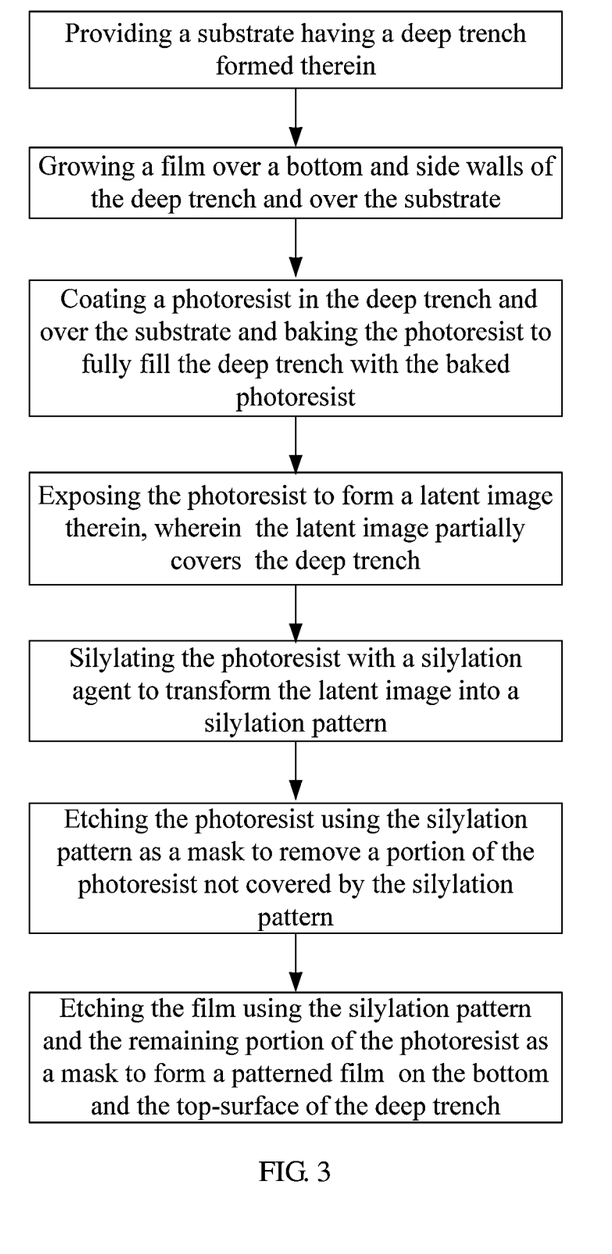
FIG. 3 shows a flow chart illustrating various steps of a method of forming a patterned film on a bottom and a top-surface of a deep trench in accordance with an embodiment of the present invention.

FIG. 3 is a flow chart illustrating various steps of a method of forming a patterned film on both a bottom and a top-surface of a deep trench in accordance with an embodiment of the present invention, while FIGS. 4a to 4g are cross-sectional views depicting the resulting structures after the steps. Herein, the top-surface of a deep trench refers to the substrate surface around the opening of the deep trench.

Figure 4A:
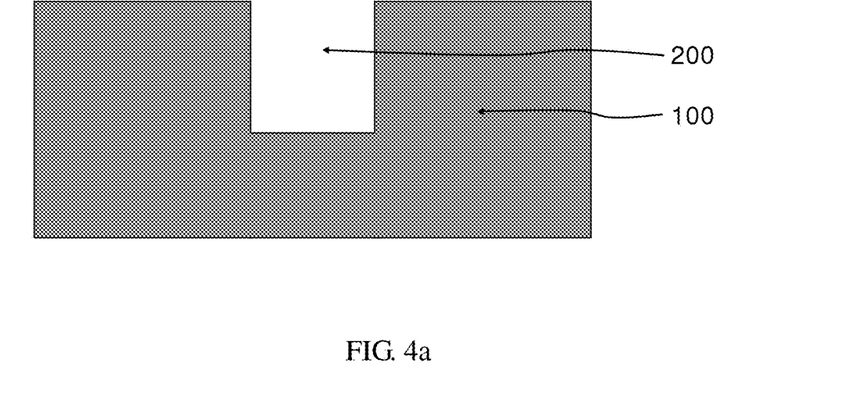
FIG. 4a depicts the resulting structure after a first step of the method is performed.

Turning now to FIG. 4a, in a first step of the method, a silicon substrate 100 is first provided, in which a deep trench 200 is formed by photolithography and etching process.

Figure 4B:
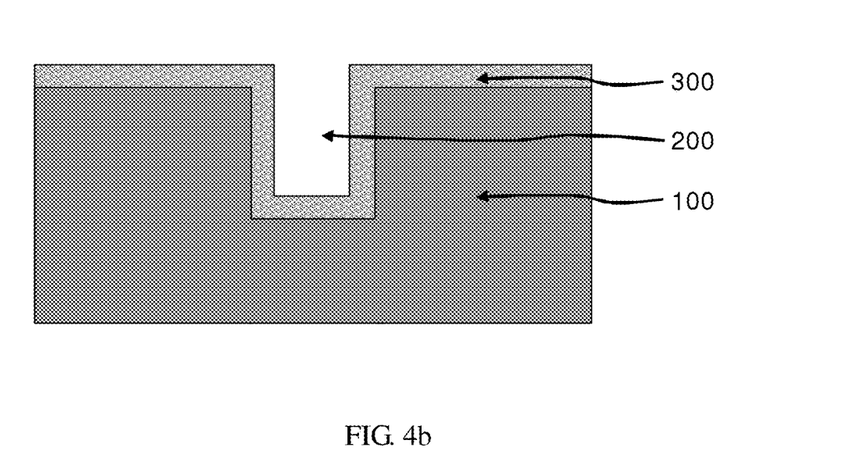
FIG. 4b depicts the resulting structure after a second step of the method is performed.

As showed in FIG. 4b, in a second step of the method, a film 300 is grown on a bottom and a top-surface of the deep trench 200, or in other words, the film 300 is grown on the bottom and side walls of the deep trench 200 and on surface of the substrate 100. A desired pattern, which has a portion located on bottom of the deep trench 200 and a portion on top of the deep trench 200, e.g. on sidewalls of the deep trench 200 and/or over the substrate 100, is to be formed in the film 300 in subsequent processes. The film 300 may be one or any combination of a dielectric film (e.g., made of silicon dioxide, silicon nitride, germanium-silicon alloy, or any combination of the above, or any other desirable material), a metal silicide film (e.g., made of tungsten silicide, cobalt silicide or the like) and a metal film (e.g., made of aluminum, gold, silver, ferronickel, or any combination of the above, or any other desirable metal).

Figure 4C:
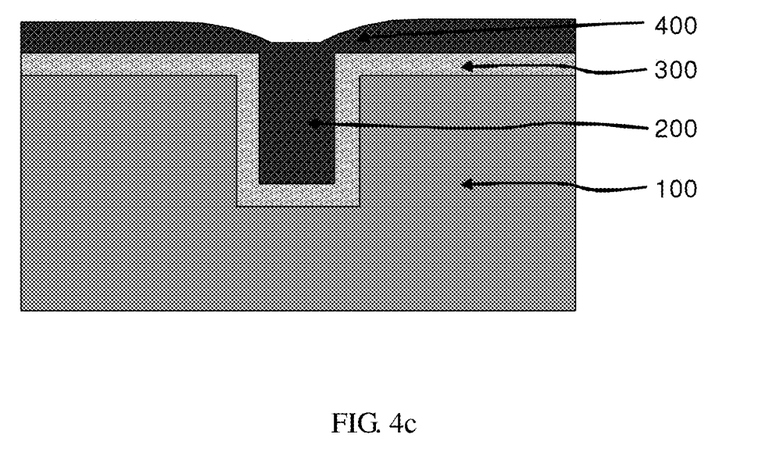
FIG. 4c depicts the resulting structure after a third step of the method is performed.

Referring to FIG. 4c, in a third step of the method, photoresist 400 is coated in the deep trench 200 and over the silicon substrate 100 (covering the film 300) and baked. The photoresist 400 does not contain hydroxyl (—OH) and/or carboxylic acid (—COOH) groups before the exposure process described below, and will contain either or both of the hydroxyl (—OH) and carboxylic acid (—COOH) groups after the exposure process. Moreover, the baked photoresist 400 is thick enough to fully fill the deep trench 200, e.g., having a thickness of 0.5 μm to 50 μm. The photoresist 400 may be coated either by spin-coating or by spray-coating, and in the case of a desired relatively great thickness (e.g., greater than 20 μm) of the photoresist 400, the spray-coating approach is generally adopted.

Figure 4D:
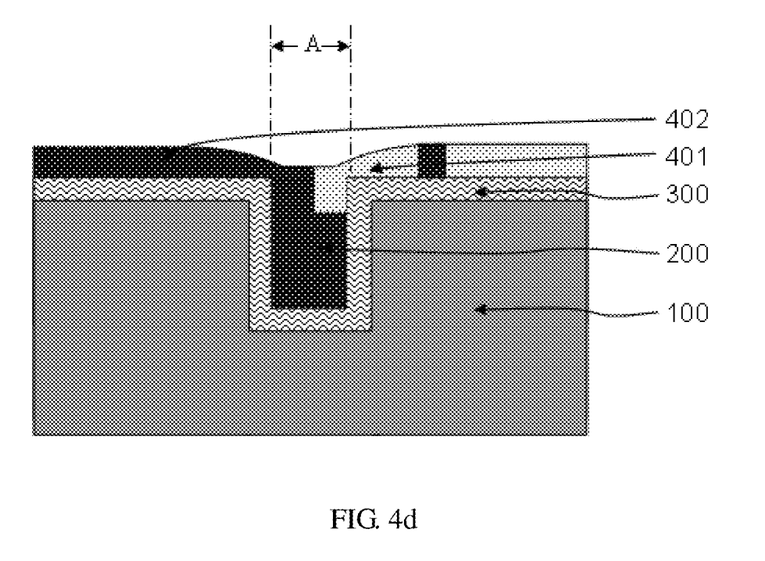
FIG. 4d depicts the resulting structure after a fourth step of the method is performed.

In a fourth step of the method, as shown in FIG. 4d, an exposure process is performed, using a mask (not shown) with the desired patterns formed therein, to form a latent image 401 in the photoresist 400, in such a manner that the latent image 401 partially covers the opening (indicated by region A) of the deep trench 200, or in other words, a projection of at least a portion of the latent image 401 is located on bottom of the deep trench 200. In FIG. 4d, the numeral 402 indicates a portion of the photoresist 400 not exposed in this step. The exposure process may be performed with a light source selected from the group consisting of a 436-nm g-line source, a 365-nm i-line source, a 248-nm KrF source and a 193-nm ArF source, and preferably, with the 365-nm i-line source.

Figure 4E:
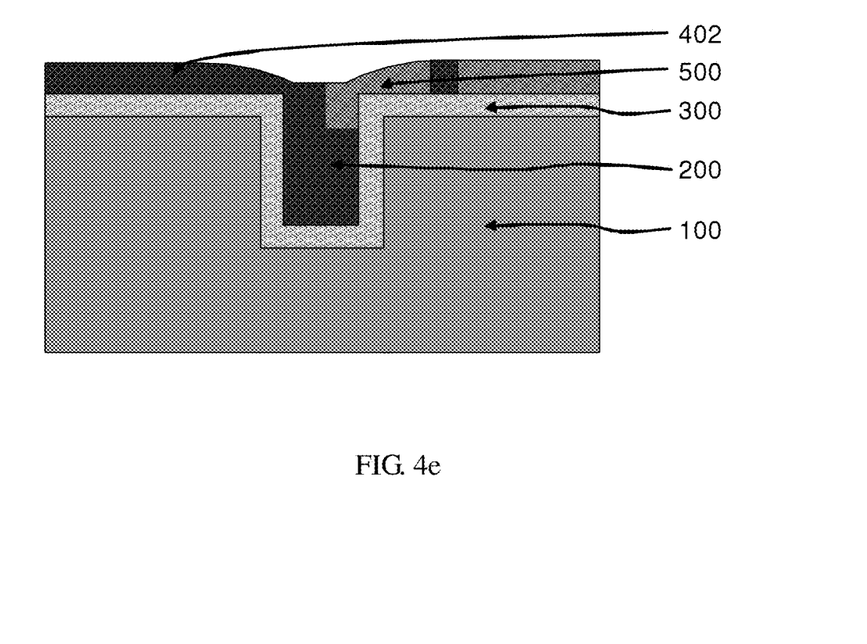
FIG. 4e depicts the resulting structure after a fifth step of the method is performed.
Figure 5:
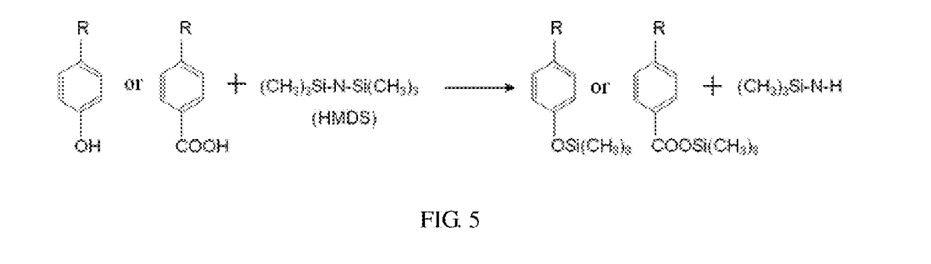
FIG. 5 shows a chemical equation representing the silylation reaction in the fourth step of the method in accordance with the embodiment of the present invention.

With reference to FIG. 4e, in a fifth step of the method, the photoresist 400 containing the latent image 401 is silylated with a silylation agent to transform the latent image 401 into a silylation pattern 500. The silylation agent may be hexamethyldisilazane (HMDS), tetramethyldisilazane (TMDS), dimethylsilyldimethylamine (DMSDMA) or (N,N-dimethylamino)trimethylsilane (TMSDEA), and preferably, HMDS is adopted. Referring to the description supra in conjunction with FIG. 4d, after exposed in the fourth step, the exposed portion of the photoresist 400 (which corresponds to the latent image 401) contains —OH and/or —COOH groups generated by the associated photochemical reaction, while the non-exposed portion 402 does not contain such groups. In this step, a silylation reaction, the chemical equation of which is shown in FIG. 5, is performed between the active hydrogen components in the —OH and/or —COOH groups contained in the latent image 401 and the silylation agent. In this embodiment, silylating the photoresist 400 is performed by exposing the photoresist 400 containing the latent image 401 formed in the fourth step to the silylation agent, wherein the silylation agent is in a gas or liquid state to allow the latent image 401 to react (i.e., the silylation reaction) at a temperature of 50° C. to 150° C. for 30 seconds to 300 seconds so as to transform the latent image 401 into the silylation pattern 500.

Figure 4F:
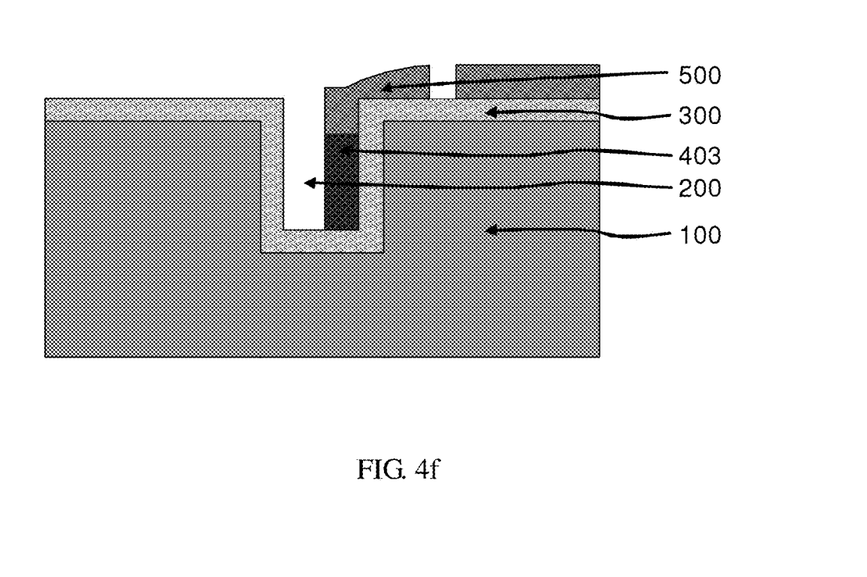
FIG. 4f depicts the resulting structure after a sixth step of the method is performed.

Next, in a sixth step of the method, as shown in FIG. 4f, the non-exposed portion 402 (see FIG. 4e) of the photoresist 400, that is not covered by the silylation pattern 500, is removed selectively by a dry etching process using the silylation pattern 500 as a mask, so that thereafter a mask pattern which is composed of the silylation pattern 500 and the remaining portion 403 of the non-exposed photoresist 402 is formed over the bottom and the side walls of the deep trenches 200 and over the substrate 100. In this embodiment, the dry etching process uses oxygen-based plasma with an oxygen flow rate of 50 standard cm³/min to 2000 standard cm /min, a pressure of 20 mTorr to 2000 mTorr and an RF source power of 100 watts to 1500 watts. It is noted that, in the dry etching process, the oxygen-based plasma has a high etching selectivity ratio of the non-exposed portion 402 of the photoresist 400 to the silylation pattern 500 formed by the silylation reaction in the fifth step, and therefore, the silylation pattern 500 can serve as a mask to dry etch the portion not covered by the silylation pattern 500 of the non-exposed portion 402, thereby enabling the remaining portion 403 covered by the silylation pattern 500 to remain along the side walls of the deep trench 200.

Figure 4G:
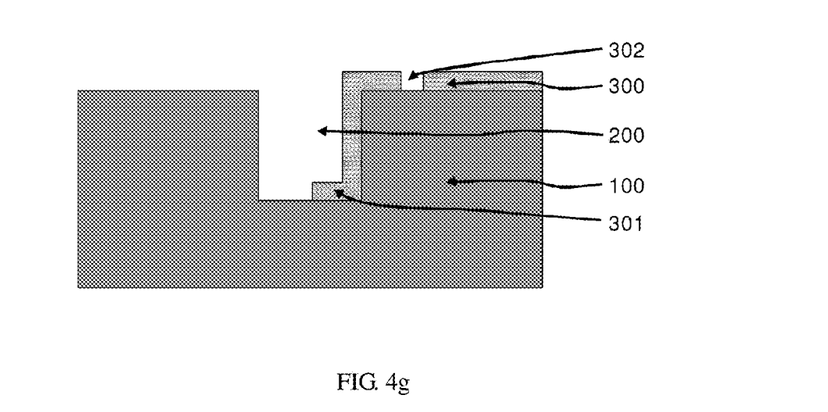
FIG. 4g depicts the resulting structure after a seventh step of the method is performed.

After that, in a seventh step of the method, as shown in FIG. 4g, the film 300 is etched using the silylation pattern 500 and the remaining portion 403 of the photoresist as a mask to simultaneously form a film pattern 301 on the bottom of the deep trench as well as a film pattern 302 on the top-surface of the deep trench. In this embodiment, the film pattern 302 is formed both over the sidewalls of the trench 200 and over the substrate 100; in other embodiments, the film pattern 302 may be formed either on the side walls of the trench 200 or over the substrate 100. In this step, according to the material of the film 300, coupled with the consideration of the etching selectivity ratio, various etching processes can be selected, including both the wet and dry etching processes. For example, in a case that the film 300 is made of aluminum, a plasma dry etching process using chlorine as a main etching gas (optionally mixed with boron trichloride, tetrafluoride, nitrogen and other gases as auxiliary gases) can be preferably selected. After the film 300 is etched, the silylation pattern 500 and the remaining portion 403 of the photoresist are removed, and thereby the film pattern 301 on the bottom of deep trench as well as the film pattern 302 on the top-surface of the deep trench (on sidewalls of the trench and/or over the substrate) are formed.

What is claimed is:

1. A method of forming a patterned film on a bottom and a top-surface of a deep trench, comprising the steps in the sequence set forth:
   step 1) providing a substrate having a deep trench formed therein;
   step 2) growing a film over a bottom and a top-surface of the deep trench;
   step 3) coating a photoresist in the deep trench and over the substrate and baking the photoresist to fully fill the deep trench with the baked photoresist, wherein the baked photoresist does not contain hydroxyl or carboxylic acid group;
   step 4) exposing the photoresist to form a latent image therein, wherein the latent image includes a first portion partially covering the deep trench and a second portion over the top-surface of the deep trench, wherein the latent image contains either or both of hydroxyl and carboxylic acid groups after the exposure process;
   step 5) silylating the photoresist with a silylation agent to transform the latent image into a silylation pattern;
   step 6) etching the photoresist using the silylation pattern as a mask to remove a portion of the photoresist not covered by the silylation pattern; and
   step 7) etching the film using the silylation pattern and the remaining portion of the photoresist as a mask to form a patterned film on the bottom and the top-surface of the deep trench.

2. The method of claim 1, wherein in the step 2), the film is one or any combination of a dielectric film, a metal silicide film and a metal film.

3. The method of claim 1, wherein in the step 3), the baked photoresist has a thickness of 0.5 μm to 50 μm.

4. The method of claim 1, wherein in the step 3), the photoresist is coated by spin-coating or spray-coating.

5. The method of claim 1, wherein in the step 4), the photoresist is exposed with a light source selected from the group consisting of a 436-nm g-line source, a 365-nm i-line source, a 248-nm KrF source and a 193-nm ArF source.

6. The method of claim 5, wherein in the step 4), the photoresist is exposed with a 365-nm i-line source.

7. The method of claim 1, wherein in the step 5), the silylation agent is selected from the group consisting of hexamethyldisilazane, tetramethyldisilazane, dimethylsilyldimethylamine and (N,N-dimethylamino)trimethylsilane.

8. The method of claim 7, wherein in the step 5), the silylation agent is hexamethyldisilazane.

9. The method of claim 1, wherein in the step 5), silylating the photoresist is performed by exposing the photoresist with the latent image formed therein to the silylation agent which is in a gas or a liquid state to allow the photoresist to react at a temperature of 50° C. to 150° C. for 30 seconds to 300 seconds.

10. The method of claim 1, wherein in the step 6), the photoresist is etched by a dry etching process.

11. The method of claim 10, wherein the dry etching process uses oxygen-based plasma with an oxygen flow rate of 50 standard cm$^3$/min to 2000 standard cm$^3$/min, a pressure of 20 mTorr to 2000 mTorr and an RF source power of 100 watts to 1500 watts.

12. The method of claim 1, wherein in the step 7), the film is etched by a wet or a dry etching process according to different materials of the film.

* * * * *